(12) United States Patent
Tavkhelidze et al.

(10) Patent No.: US 6,281,139 B1
(45) Date of Patent: Aug. 28, 2001

(54) WAFER HAVING SMOOTH SURFACE

(75) Inventors: Avto Tavkhelidze; Amiran Bibilashvili; Zaza Samadashvili, all of Tbilisi, GA (US)

(73) Assignee: Borealis Technical Limited (GI)

( * ) Notice: Subject to any disclaimer, the term of this patent is extended or adjusted under 35 U.S.C. 154(b) by 0 days.

(21) Appl. No.: 09/476,644

(22) Filed: Dec. 31, 1999

(51) Int. Cl.[7] ................... H01L 21/31; H01L 21/469

(52) U.S. Cl. ................... 438/763; 438/758; 438/761

(58) Field of Search ..................... 438/758, 761, 438/763, 974

(56) References Cited

U.S. PATENT DOCUMENTS

3,602,778 * 8/1971 Mitsuru et al. ................. 317/234 R

* cited by examiner

Primary Examiner—John F. Niebling
Assistant Examiner—David A Zarneke

(57) ABSTRACT

A method for preparing a wafer having a smooth surface is disclosed. The present invention includes the step of preparing a wafer base and a first material on the wafer base. The wafer base and first material have a surface and a plurality of holes. The present invention includes the step of depositing a second material at an angle on the first material such that the second material is substantially on the surface. The present invention includes the step of exposing the first material and the second material to an oxidizing agent. The present includes the step of reacting a third material on the second surface to close the holes.

6 Claims, 3 Drawing Sheets

WAFER HAVING SMOOTH SURFACE

TECHNICAL FIELD OF THE INVENTION

The present invention relates to creating a wafer for use in a diode device and, more particularly, to an apparatus and method for preparing a wafer having smooth areas on a wafer surface.

BACKGROUND OF THE INVENTION

Wafers are used in a variety of applications, including diode and integrated circuit devices. Wafers may be comprised of different materials. Known applications may use wafers made of silicon, or the like. For silicon wafers, the silicon crystal is grown to create the wafer. Silicon is included in the wafer because of its desirable electrical properties.

As silicon is grown via crystals holes appear on the surface of the wafer. The holes may be known as polishing local defects ("PLD"). PLDs may have the shape of a hole with a diameter and a depth varying between 1 to 10 micrometers. PLDs may be induced during polishing, however, the center of the PLDs are created by dislocations in the crystal lattice during the growing of the silicon crystal on the wafer.

In most known applications, it may be acceptable to have a wafer surface smooth down to 10 Angstroms. Thus, the majority of the area on the wafer surface is smooth, while the remaining surface includes holes. For example, the average number of holes per square centimeter may be 1 in the center of the wafer and about 10 near the edges of the wafer. Known methods and applications, however, have been inadequate in reducing the number of holes per square centimeter on the wafers for sub-atomic applications. Wafer surfaces that are used in piezo-electric devices, such as sandwiches having a cathode and an anode, may exhibit detrimental affects due to PLDs. A PLD may result in a short circuit between electrodes in diode applications.

Silicon crystals having almost no PLDs are grown in orbit to overcome the gravitation influence on the crystal growing process. The orbit growing process, however, is expensive and time-consuming. Further, access to orbit growing device platforms is prohibitive.

SUMMARY OF THE INVENTION

Thus, a need has arisen for preparing a wafer having a smooth surface. A method and apparatus for preparing a wafer is provided that substantially eliminates and reduces the disadvantages and problems associated with conventional methods. Elementary particles have wave properties, and corpuscular properties. Related U.S. patent application Nos. 09/020,654 to Tavkhelidze, herein incorporated by reference, and 09/045,299 to Cox et al, herein incorporated by reference, describe that wave interference is possible under certain conditions.

In an embodiment of the present invention, a method for preparing a wafer having a smooth surface is provided that substantially eliminates and reduces the disadvantages and problems associated with conventional methods. The present invention describes a novel method of preparing a wafer surface. The method includes the step of depositing a first material on a wafer base to form holes and a surface. The method also includes the step of depositing a second material at an angle on the first material such that the second material is only on the surface. The method also includes the step of exposing the first and the second material. The method also includes the step of growing electrochemically a third material on the surface of the second material to enclose the holes.

In a preferred embodiment, the wafer base includes a silicon base. The first material comprises lead. The lead material is deposited on the wafer surface in a known fashion. The second material is deposited on the first material at an angle. The second material comprises silver. The first and second materials are exposed to air. A third material comprising copper is grown on the silver material via electrochemical growth. Thus, in accordance with the present invention, the wafer surface is prepared having an anode with holes exactly in the same places as a cathode such that there is a smooth area that repeats the surfaces of the anode and cathode within a diode device and prevents short circuits.

The technical advantage of the present invention is that a method for preparing a wafer surface is provided that reduces the effect of holes within the wafer surface. Another technical advantage of the present invention is that wafers may be prepared at a reduced cost. Another technical advantage of the present invention is that wafers may be produced more efficiently and timely. Another technical advantage of the present invention is that a wafer is prepared that reduces the occurrences of short circuits in diode device applications.

BRIEF DESCRIPTION OF THE DRAWINGS

Embodiments of the invention will now be described with reference to appropriate figures, which are given by way of example only, and are not intended to limit the present invention.

DETAILED DESCRIPTION OF THE INVENTION

An embodiment of the present invention and its advantages are best understood by referring in more detail to FIGS. 1–6, in which like numerals refer to like parts. FIGS. 1–6 disclose a method and apparatus for preparing a wafer surface in accordance with an embodiment of the present invention.

Figure 1:
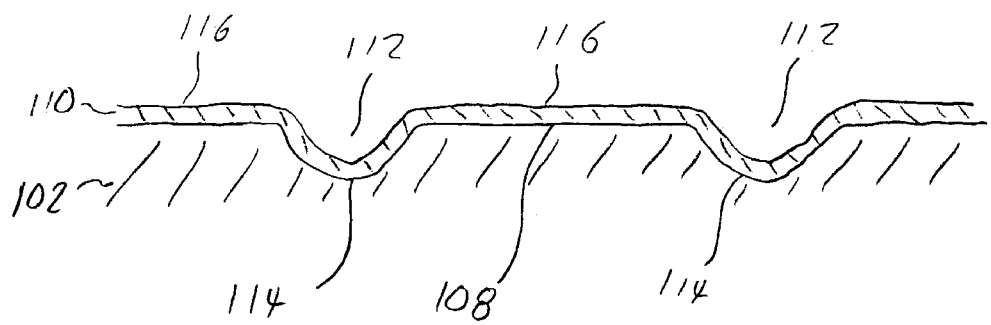
FIG. 1 illustrates a first material on a wafer base in accordance with an embodiment of the present invention.

FIG. 1 depicts a wafer base 102 and first material 110 in accordance with an embodiment of the present invention. Preferably, wafer base 102 is comprised of silicon that is grown in accordance with known methods. Further, first material 110 preferably is comprised of lead that is deposited on wafer base 102. Wafer base 102 also includes a plurality of smooth areas and a plurality of holes. Referring to FIG. 1, holes 114 are on the surface of wafer base 102. Holes 114 may have a diameter and a depth varying between 1 to 10 micrometers. Holes 112 correlate to holes 114 and are within first material 110. Holes 112 repeat the indentation of holes 114. These holes or indentations may be known as PLDs. Smooth areas 116 represent those areas on wafer base 102 not having holes or indentations that correlate to smooth areas 108.

Figure 2:
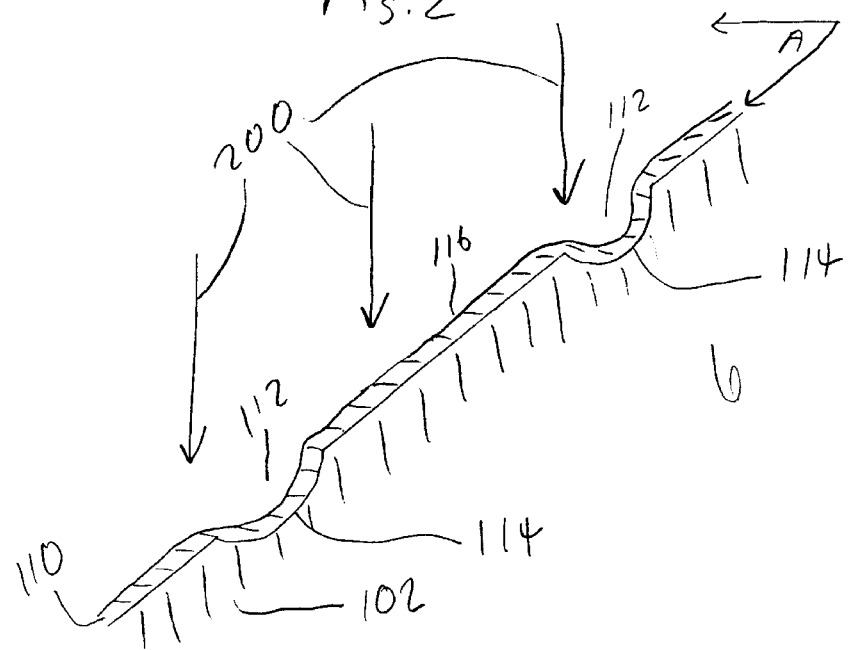
FIG. 2 illustrates the deposit of a second material on the first material and wafer base in accordance with an embodiment of the present invention.

FIG. 2 depicts a second material 200 being deposited on first material 112 in accordance with an embodiment of the present invention. Wafer base 102 is tilted at an angle A as second material 200 is deposited. Preferably, angle A is not equal to 90 degrees. More preferably, angle A is about 60 degrees. Second material 200 is deposited on wafer base 102 and at first material 110 in a selective manner only on smooth areas 116. Second material 200 does not seep materially or substantially within inside holes 112. Preferably, second material 200 comprises silver. Alternatively, second material 200 may be any material that does not react with first material 110.

Figure 3:
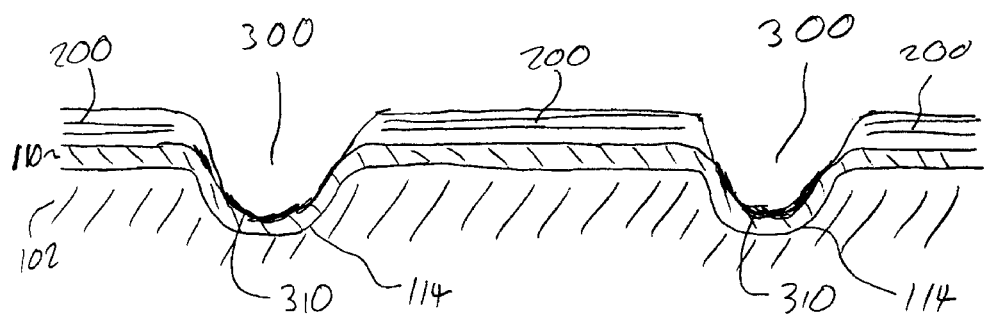
FIG. 3 illustrates a deposition of a second material on a first material and a wafer base in accordance with an embodiment of the present invention.

FIG. 3 depicts second material 200 deposited on wafer base 102 and first material 110 in accordance with an embodiment of the present invention. Second material 200 rests on wafer base 102 and first material 110. Because second material 200 was deposited only on smooth areas 116, second material 200 is not materially within holes 300. A small amount of second material 200 may seep partly along one side of holes 300. Preferably, this amount is about or less than 20% of holes 300. Holes 300 correlate to holes 112, as described above. Thus, second material 200 is deposited on smooth areas of wafer base 102 and first material 110 and not substantially in holes 300, or PLDs, that expose first material 110.

Portions 310 represent oxidized portions of first material 110. Because second material 200 does not completely cover first material 110 in holes 300, part of first material 110, or portions 310, is exposed to an oxidizing agent, such as air. Thus, portions inside holes 300 are oxidized. Surfaces covered by second material 200 are not exposed to air and do not oxidize. Preferably, portions 310 are exposed for about 1 to about 10 hours.

Figure 4:
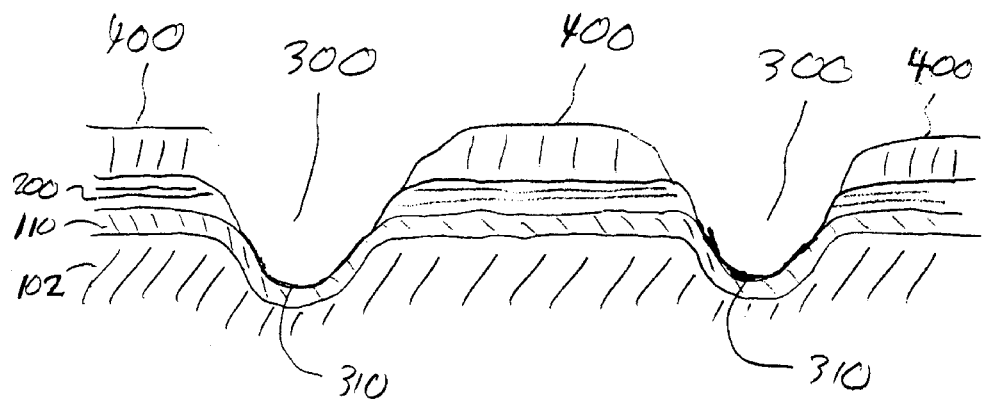
FIG. 4 illustrates a third material, a second material, first material, and a wafer base in accordance with an embodiment of the present invention.

FIG. 4 depicts a third material 400, second material 200, and first material 110 on wafer base 102 in accordance with an embodiment of the present invention. Third material 400 grows electrochemically on second material 200 such that third material 400 grows to provide another layer. Third material 400 grows on second material 200 such that third material 400 is not materially within holes 300. Thus, third material 400 does not come materially into contact with first material 110 of wafer base 102. Preferably, third material 400 comprises copper. More preferably, third material 400 comprises copper that is electro-chemically grown on second material 200. Alternatively, third material 400 may comprise a material that reacts on second material 200, but not on first material 110. For example, if first material 110 comprises lead and second material 200 comprises silver, third material 400 comprises copper that does not grow on lead, or more precisely, on its oxide within portions 310. Copper, however, grows on silver. Thus, second material 200 separates third material 400 from wafer base 102. Third material 400 may be a layer having a thickness of about 100 to 200 micrometers.

As described above, third material 400 may be electrochemically grown on second material 200. In those areas that are flat on wafer base 102, first material 110, and second material 200, the current of the electrochemical process flows through first material 110 and second material 200 with negligible resistance. Near holes 300, the current meets resistance by portions 310. Portions 310 form resistance because of their oxidized state. Third material 200 does not grow in these areas as the current chooses the path of least resistance.

Figure 5:
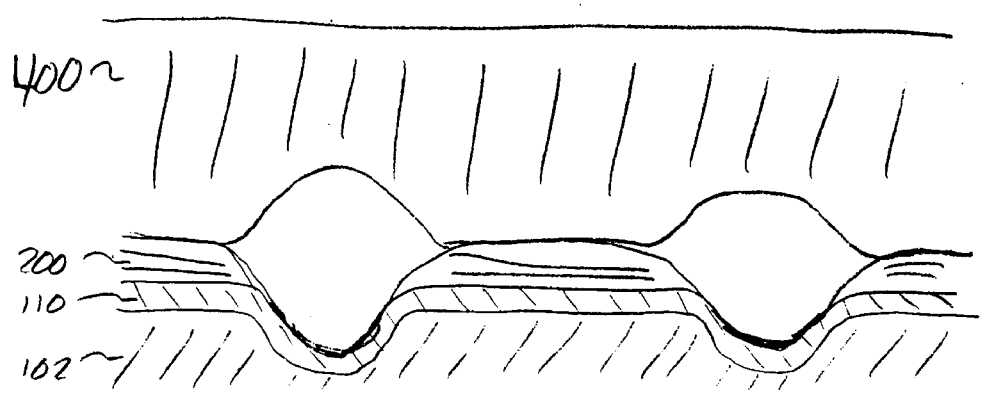
FIG. 5 illustrates a completed wafer in accordance with an embodiment of the present invention.

FIG. 5 depicts a completed third material 400, second material 200, first material 110 and wafer base 102 in accordance with an embodiment of the present invention. Third, material 400 further reacts by growing electrochemically on second material 200. As third material 400 grows, it increases in thickness. Preferably third material 400 grows to a thickness of about 200 micrometers. Thus, the prepared wafer comprises wafer base 102, first material 110, second material 200, and third material 400. As material 400 grows, it forms reversed holes that are opposite holes 300. Thus, material 400 also has holes after the growing process is completed.

Figure 6:
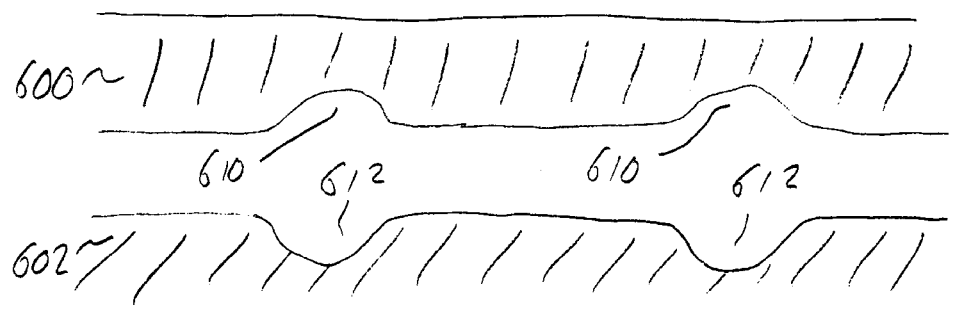
FIG. 6 illustrates two electrodes in accordance with an embodiment of the present invention.

FIG. 6 depicts an electrode 600 and an electrode 602 in accordance with an embodiment of the present invention. Electrode 600 comprises third material 400 and second material 200. Electrode 602 comprises wafer base 102. First material 110 is removed from electrodes 600 and 602. Electrode 602 has holes 612 that correlate to holes 114 on wafer base 102. Electrode 600 has holes 610 located opposite holes 613. Thus, empty spaces are created between electrodes 600 and 602. If movement occurs due to thermal expansion of electrodes 600 and 602 during heat expansion of the electrodes, the spaces allow the movement without detrimental effects. In other words, protrusions are not formed on electrodes 600 and 602 where holes 612 are located. Because holes, and not protrusions, are formed, electrodes 600 and 602 do not touch during device operation.

Thus, it is apparent that there has been provided, in accordance with an embodiment of the present invention, a wafer surface that satisfies the advantages set forth above. Although the present invention has been described in detail, it should be understood that various changes, substitutions, and alterations may be made herein. Other examples are readily ascertainable by one skilled in the art and can be made without departing from the spirit and the scope of the present invention as defined by the following claims.

What is claimed is:

1. A method for preparing a wafer surface, the method comprising the steps of:

preparing a wafer base and a first material on said wafer base having a surface and a plurality of holes;

depositing a second material at an angle on said first material such that said second material is substantially on said surface;

exposing said first material and said second material to an oxidizing agent and reacting a third material on said second surface to close said holes.

2. The method of claim 1, further comprising the step of:

oxidizing a portion of said first material, said portion located in said plurality of holes.

3. The method of claim 1, wherein said depositing step includes depositing said second material at a non-perpendicular angle.

4. The method of claim 1, wherein said reacting step includes growing said third material on said second material.

5. The method of claim 4, wherein said growing step includes growing by an electro-chemical process.

6. The method of claim 1, further comprising the step of:

polishing said wafer base.

* * * * *